United States Patent
Chen

(10) Patent No.: US 12,046,648 B2
(45) Date of Patent: Jul. 23, 2024

(54) SEMICONDUCTOR WITH FASTER CONDUCTION FOR RAPID WRITING TO MEMORY

(71) Applicant: HON HAI PRECISION INDUSTRY CO., LTD., New Taipei (TW)

(72) Inventor: Chung-Yi Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 410 days.

(21) Appl. No.: 17/538,010

(22) Filed: Nov. 30, 2021

(65) Prior Publication Data

US 2022/0246741 A1    Aug. 4, 2022

(30) Foreign Application Priority Data

Feb. 1, 2021    (CN) .......................... 202110139336.6

(51) Int. Cl.
*H01L 29/423*    (2006.01)
*H10B 41/27*    (2023.01)

(52) U.S. Cl.
CPC ....... *H01L 29/42328* (2013.01); *H10B 41/27* (2023.02)

(58) Field of Classification Search
CPC ......... H01L 29/42328; H01L 29/40114; H01L 29/7889; H10B 41/27; H10B 41/35; H10B 41/30; H10B 41/10; H10B 41/00
See application file for complete search history.

(56) References Cited

U.S. PATENT DOCUMENTS

| | | | | |
|---|---|---|---|---|
| 9,786,677 B1* | 10/2017 | Khoueir | ............... | H10B 43/35 |
| 10,424,384 B2* | 9/2019 | Higashi | ............... | G11C 11/5671 |
| 11,063,057 B2* | 7/2021 | Jung | ............... | H10B 43/35 |
| 11,171,157 B1* | 11/2021 | Lai | ............... | H10B 51/20 |
| 2007/0058444 A1* | 3/2007 | Riedel | ............... | G11C 16/16 |
| | | | | 365/185.29 |
| 2013/0264629 A1* | 10/2013 | Whang | ............... | H10B 41/27 |
| | | | | 257/E21.422 |
| 2015/0214240 A1* | 7/2015 | Ahn | ............... | H10B 41/35 |
| | | | | 438/259 |
| 2015/0380089 A1 | 12/2015 | Aritome | | |
| 2020/0365213 A1* | 11/2020 | Jeon | ............... | G11C 16/32 |
| 2020/0388628 A1* | 12/2020 | Li | ............... | H10B 43/27 |
| 2021/0408253 A1* | 12/2021 | Chang | ............... | H01L 29/40114 |

* cited by examiner

*Primary Examiner* — Shahed Ahmed
*Assistant Examiner* — Khatib A Rahman
(74) *Attorney, Agent, or Firm* — ScienBiziP, P.C.

(57) ABSTRACT

A semiconductor with 3D flash memory storing cells includes a stack structure in each storing cell, a blocking layer, at least one floating gate layer, a tunnel dielectric layer, and a channel layer. The stack structure includes at least one control gate layer, at least one dielectric layer, and at least one erasing layer. The blocking layer is coplanar with the control gate layer. The floating layer is received in the blocking layer, and insulates the control gate layer by the blocking layers. The tunnel dielectric layer covers sides of the blocking layer and the floating gate layer. The channel layer is placed on a side of the tunnel electric layer. When the storing cell executes a data reading and writing process, a voltage is applied on the erasing layer to reduce a series resistance of the channel layer for rapid conduction by the semiconductor.

1 Claim, 2 Drawing Sheets

SEMICONDUCTOR WITH FASTER CONDUCTION FOR RAPID WRITING TO MEMORY

FIELD

The subject matter herein generally relates to semiconductor memory.

BACKGROUND

Current three-dimensional (3D) flash memory can store data for a long period without being powered, and has advantages of high-density, and easier and faster reading from and writing to storage. As a size of the 3D flash becomes smaller, based on a smaller cross-section area of the channel layer in the 3D flash, it is hard to reduce a relative vertical resistance of the channel layer by ion injection, thus a data writing speed of the 3D flash is less than optimal.

Thus, there is room for improvement in the art.

BRIEF DESCRIPTION OF THE FIGURES

Implementations of the present disclosure will now be described, by way of example only, with reference to the attached figures.

DETAILED DESCRIPTION

Figure 1:
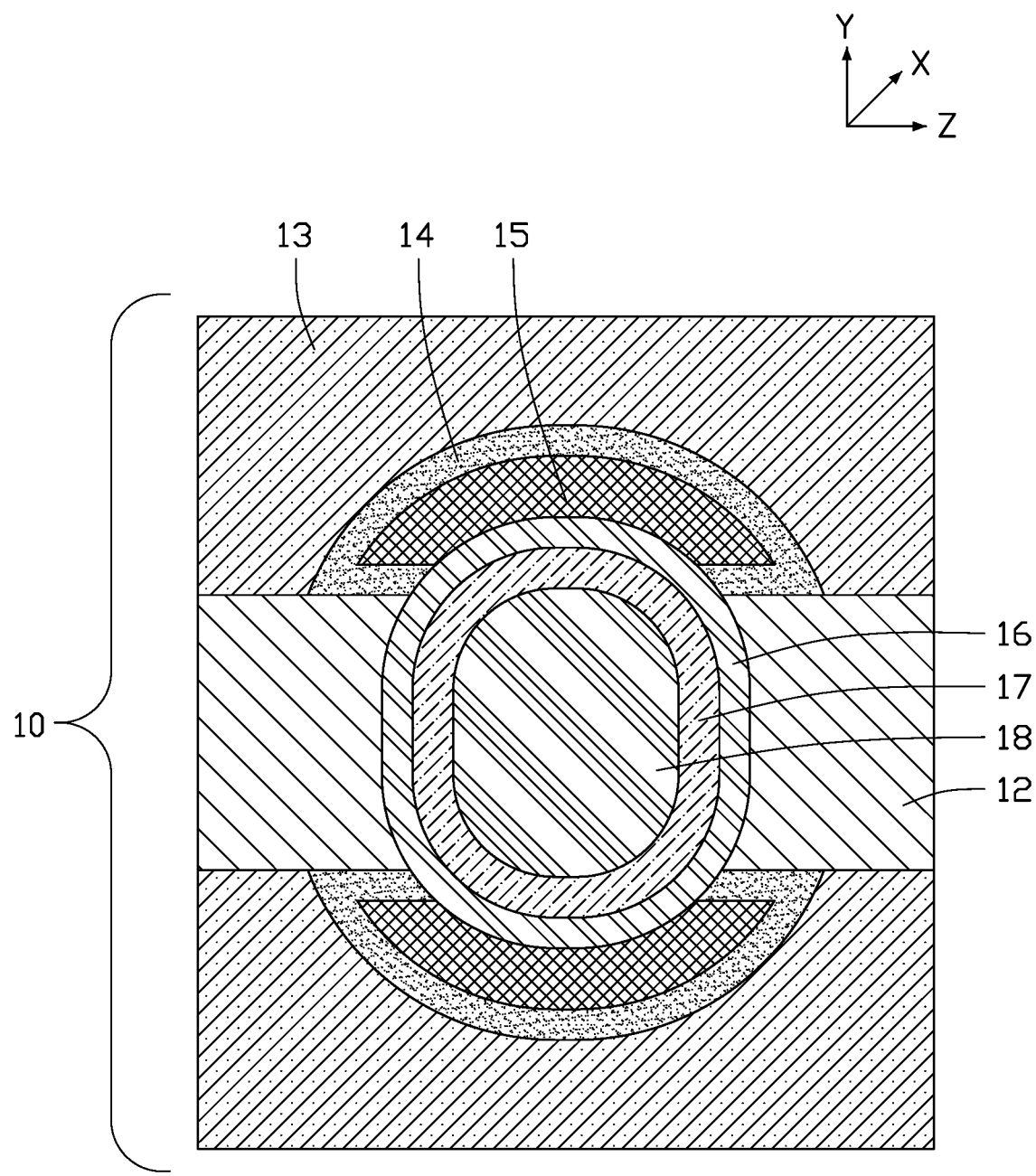
FIG. 1 is a diagram illustrating an embodiment of a semiconductor along a horizontal direction.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure provides a semiconductor with improved conduction speed.

Figure 2:
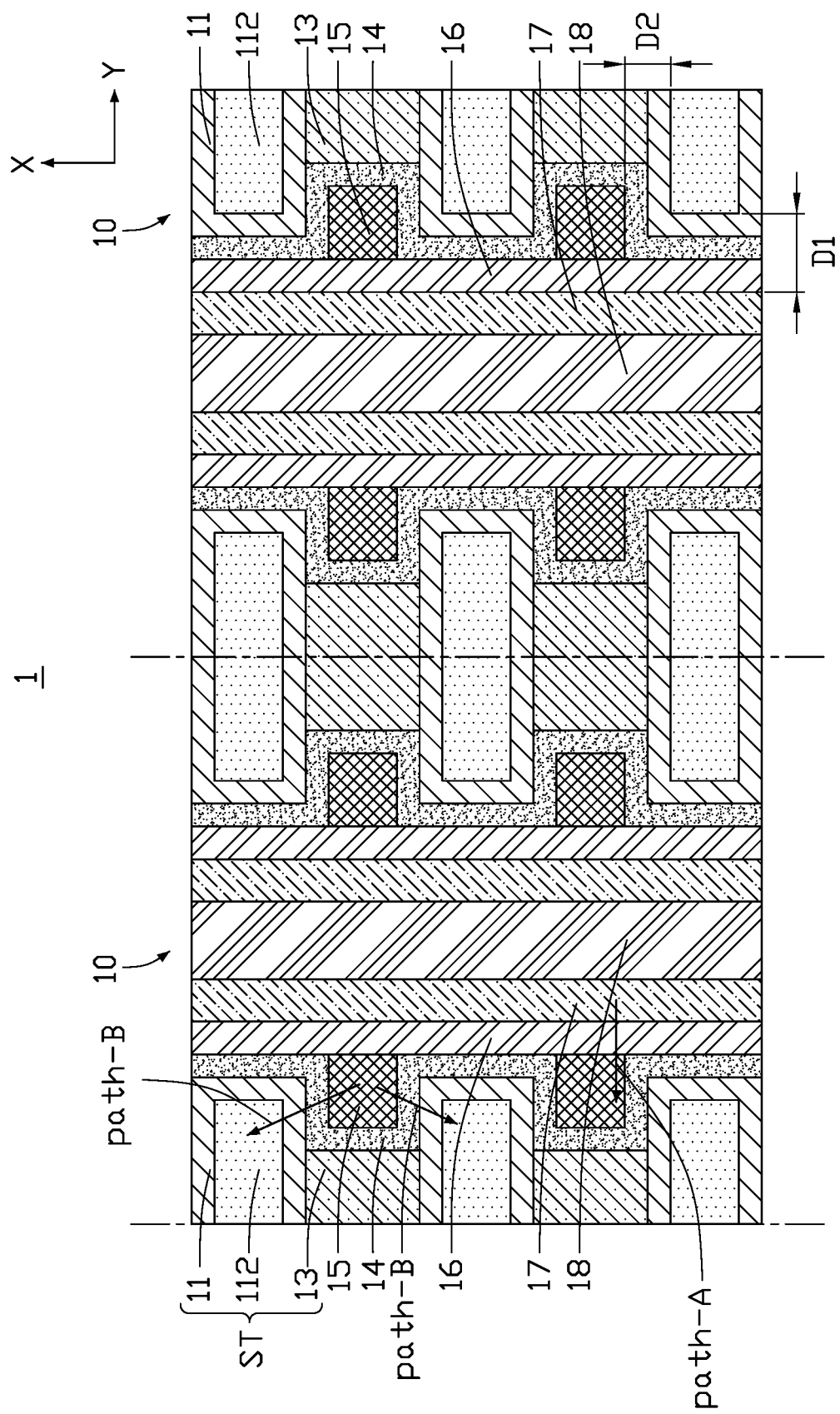
FIG. 2 is a diagram illustrating an embodiment of the semiconductor along a vertical direction.

FIG. 1 shows a semiconductor 1 taken along a horizontal direction. FIG. 2 shows the semiconductor 1 taken along a vertical direction. The semiconductor 1 in a stack structure includes a plurality of storing cells 10. FIG. 1 only shows one storing cell 10, and FIG. 2 show two adjacent storing cells 10. In one embodiment, the semiconductor 1 can comprise a three-dimensional (3D) flash memory. Each storing cell 10 can be implemented to store data or allow erasure of data.

Each storing cell 10 includes a stack structure ST, an insulating layer 12, a floating gate layer 15, a blocking layer 14, a tunnel dielectric layer 16, a channel layer 17, and a filling layer 18.

The stack structure ST includes at least one control gate layer 13, at least one dielectric layer 11, and at least one erasing layer 112. In one embodiment (as shown in FIG. 2), the stack structure ST includes two control gate layers 13, a dielectric layer 11, and three erasing layers 112. The control gate layers 13 are placed in the dielectric layer 11. Each erasing layer 112 is separated from the control gate layer 13 by the dielectric layer 11. The erasing layer 112 is separated from the control gate layer 13 by the dielectric layer 11, and is separated from the floating gate layer 15 by the dielectric layer 11 and the blocking layer 14. The erasing layer 112 is made of conductive material with low resistance, such as metal or silicide.

The blocking layer 14, the tunnel dielectric layer 16, the channel layer 17, and the filling layer 18, which are inside the control gate layer 13, are substantially annular in shape (as shown in FIG. 1). The channel layer 17 is outside of the filling layer 18, and the tunnel dielectric layer 16 is outside the channel layer 17.

The floating gate layer 15 is received in the blocking layer 14. Along a second horizontal direction Y, the floating gate layer 15 is coplanar with the control gate layer 13. Along a first vertical direction X, the floating gate layer 15 is partly overlapped with the erasing layer 112. In one embodiment, the floating gate layer 15 is made of conductive material, such as silicide. The floating gate layer 15 is used for storing data.

Along the second horizontal direction Y, a first thickness layer D1 of the dielectric layer 11 is placed between the erasing layer 112 and the channel layer 17. Along the first vertical direction X, a second thickness layer D2 of the dielectric layer 11 is placed between the erasing layer 112 and the floating gate layer 15. A breakdown voltage of the first thickness layer D1 is larger than a breakdown voltage of the second thickness layer D2 (as shown in FIG. 2).

Along the second horizontal direction Y, the insulating layer 12 is insulated and separated from the adjacent blocking layer 14. Along a third direction Z, the insulating layer 12 is insulated and separates the tunnel dielectric layer 16 from the tunnel dielectric layer 16 in the adjacent storing cell 10 (as shown in FIG. 1). In one embodiment, the insulating layer 12 is made of silicon oxide material.

While the storing cell 10 executes a data reading and storing process, a voltage is applied on the control gate layer 13, and the electrons move along a data writing path (path-A) from the channel layer 17 into the floating gate layer 15 through the tunnel electric layer 16, thus the data is stored in the storing cell 10. Further, a specified voltage is applied on the erasing layer 112, and a series resistance of the channel layer 17 is reduced, thus the semiconductor 1 conducts rapidly, and a speed of the data writing and reading process of the semiconductor 1 is increased. In one embodiment, the specified voltage is in a range from 3-8 volts (V). In other embodiments, the specified voltage can be adjusted to be different range or value, according to different requirement of the semiconductor 1.

While the storing cell 10 executes a data erasing process, a positive voltage is applied on the erasing layer 112, and the floating gate layer 15 floats. A voltage less than the specified voltage is applied on the control gate layer 13, avoiding a punch-through between the erasing layer 112 and the control gate layer 13. Further, a ground voltage or a negative voltage is applied on the channel layer 17, thus the electrons move along a data erasing path (path-B) from the floating gate layer 15 to the erasing layer 112 through the portion of the dielectric layer 11. The dielectric layer 11 is overlapped with the erasing layer 112 and the floating gate layer 15, and the sidewall of the blocking layer 14. Such electrons do not pass through the tunnel dielectric layer 16 (as shown in FIG. 2). In one embodiment, the positive voltage is in a range from 10-15V. In other embodiments, the positive voltage can be other value.

While the semiconductor 1 executes the data reading and writing process, the specified voltage is applied on the erasing layer 112 for reducing the series resistance of the channel layer 17, the semiconductor 1 quickly conducts, thus the data reading and writing process of the semiconductor 1 is improved.

While executing a data erasing process, a positive voltage is applied on the erasing layer 112, the floating gate layer 15 floats, a voltage less than the positive voltage is applied on the control gate layer 13, thus avoiding a punch-through between the erasing layer 112 and the control gate layer 13. Further, a ground voltage or a negative voltage is applied on the channel layer 17, and the electron moves along a data erasing path path-B from the floating gate layer 15 to the erasing layer 112 through the portion of the dielectric layer 11, which is overlapped with the erasing layer 112 and the floating gate layer 15, and the sidewall of the blocking layer 14. Such electrons do not pass through the tunnel dielectric layer 16. In one embodiment, the positive voltage is in a range from 10-15 volts (V).

The erasing layer 112 being overlapped with the floating gate layer 15 along the first vertical direction X causes the electrons to move along the path-B, a path different from the data writing path, path-A. Thus, even repeated data writing and data erasing processes cause less dissipation of the tunnel dielectric layer 16 in the storing cell 10, and a lifetime of the semiconductor 1 is extended.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A semiconductor comprising:
   several storing cells; each storing cell comprising:
   a stack structure with at least one control gate layer, at least one dielectric layers, and at least one erasing layer;
   a blocking layer, being coplanar with the control gate layer;
   a floating gate layer received in the blocking layer, and configured to be insulated from the at least one control gate layer by the blocking layer;
   a tunnel dielectric layer, configured to cover sides of the blocking layer and the floating gate layer; and
   a channel layer, being placed on a side of the tunnel dielectric layer;
   wherein when the storing cell executes a data reading and writing process, a voltage is applied on the erasing layer to reduce a series resistance of the channel layer for making the semiconductor to being quickly conducted;
   wherein along a direction parallel with a surface of the stack structure, a first thickness layer of the dielectric layer is placed between the erasing layer and the channel layer; along a direction perpendicular to the stack structure, a second thickness layer of the dielectric layer is placed between the erasing layer and the floating gate layer; a breakdown voltage of the first thickness layer is larger than a breakdown voltage of the second thickness layer.

* * * * *